United States Patent
Malone et al.

(10) Patent No.: US 8,735,284 B2
(45) Date of Patent: May 27, 2014

(54) CONDUCTIVE METAL AND DIFFUSION BARRIER SEED COMPOSITIONS, AND METHODS OF USE IN SEMICONDUCTOR AND INTERLEVEL DIELECTRIC SUBSTRATES

(71) Applicant: International Business Machines Corporation, Armonk, NY (US)

(72) Inventors: Kelly Malone, Newburgh, NY (US); Habib Hichri, Corona, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/077,805

(22) Filed: Nov. 12, 2013

(65) Prior Publication Data

US 2014/0072796 A1    Mar. 13, 2014

Related U.S. Application Data

(62) Division of application No. 12/986,266, filed on Jan. 7, 2011.

(51) Int. Cl.
*H01L 21/44* (2006.01)

(52) U.S. Cl.
USPC ..... 438/653; 438/597; 438/652; 257/E21.476

(58) Field of Classification Search
USPC .......................................................... 438/653
See application file for complete search history.

(56) References Cited

U.S. PATENT DOCUMENTS

| | | | |
|---|---|---|---|
| 4,421,569 A | 12/1983 | Dichter et al. | |
| 4,547,270 A | 10/1985 | Naarmann | |
| 5,284,543 A | 2/1994 | Kusano et al. | |
| 5,751,018 A | 5/1998 | Alivisatos et al. | |
| 5,885,753 A | 3/1999 | Crooks et al. | |
| 6,022,597 A | 2/2000 | Yan et al. | |
| 6,287,687 B1 | 9/2001 | Yializis et al. | |
| 6,306,975 B1 | 10/2001 | Zhao et al. | |
| 6,335,571 B1 | 1/2002 | Capote et al. | |
| 6,436,825 B1 | 8/2002 | Shue | |
| 6,458,630 B1 | 10/2002 | Daubenspeck et al. | |
| 6,528,432 B1 | 3/2003 | Ngo et al. | |
| 6,566,170 B1 | 5/2003 | Marion et al. | |
| 6,605,874 B2 | 8/2003 | Leu et al. | |
| 6,828,581 B2 | 12/2004 | Zangmeister et al. | |
| 7,070,922 B2 | 7/2006 | Amontov et al. | |
| 7,132,678 B2 | 11/2006 | Kagan et al. | |
| 7,132,680 B2 | 11/2006 | Afzali-Ardakani et al. | |
| 7,196,385 B2 | 3/2007 | Bureau et al. | |
| 7,229,847 B2 | 6/2007 | Hsu et al. | |
| 7,309,658 B2 | 12/2007 | Lazovsky et al. | |
| 7,605,050 B2 | 10/2009 | Bureau et al. | |
| 2006/0189113 A1 | 8/2006 | Vanheusden et al. | |
| 2007/0062817 A1 | 3/2007 | Monchoix et al. | |

(Continued)

*Primary Examiner* — Angel Roman

(74) *Attorney, Agent, or Firm* — Scully, Scott, Murphy & Presser, P.C.; Catherine Ivers, Esq.

(57) ABSTRACT

A metal seed composition useful in seeding a metal diffusion barrier or conductive metal layer on a semiconductor or dielectric substrate, the composition comprising: a nanoscopic metal component that includes a metal useful as a metal diffusion barrier or conductive metal; an adhesive component for attaching said nanoscopic metal component on said semiconductor or dielectric substrate; and a linker component that links said nanoscopic metal component with said adhesive component. Semiconductor and dielectric substrates coated with the seed compositions, as well as methods for depositing the seed compositions, are also described.

20 Claims, 2 Drawing Sheets

(56) References Cited

U.S. PATENT DOCUMENTS

| | | |
|---|---|---|
| 2007/0262449 A1 | 11/2007 | Bispo et al. |
| 2008/0083299 A1 | 4/2008 | Simone et al. |
| 2008/0085410 A1 | 4/2008 | Simone et al. |
| 2008/0249272 A1 | 10/2008 | Bureau et al. |
| 2008/0261044 A1 | 10/2008 | Lalli et al. |
| 2008/0290515 A1 | 11/2008 | Arunachalam et al. |
| 2008/0303155 A1 | 12/2008 | Lu et al. |
| 2009/0020734 A1 | 1/2009 | Jang et al. |
| 2009/0056991 A1 | 3/2009 | Kuhr et al. |
| 2009/0302280 A1 | 12/2009 | Simone et al. |
| 2010/0019334 A1 | 1/2010 | Ivanov et al. |
| 2010/0035359 A1 | 2/2010 | Cormack et al. |
| 2010/0051909 A1 | 3/2010 | Richter et al. |
| 2011/0155968 A1 | 6/2011 | Iha et al. |

CONDUCTIVE METAL AND DIFFUSION BARRIER SEED COMPOSITIONS, AND METHODS OF USE IN SEMICONDUCTOR AND INTERLEVEL DIELECTRIC SUBSTRATES

CROSS REFERENCE TO RELATED APPLICATION

This application is a divisional of U.S. patent application Ser. No. 12/986,266, filed Jan. 7, 2011 the entire content and disclosure of which is incorporated herein by reference.

BACKGROUND

The present application relates to compositions and methods for depositing conductive metal and diffusion barrier compositions, and in particular, seed compositions and methods of using seed compositions for producing a layer of a conductive metal or diffusion barrier layer in a semiconductor or interlevel dielectric substrate.

As known in the art, conventional multilayer semiconductor structures generally include a semiconductor substrate (e.g., silicon, silicon carbide, or gallium arsenide) containing thereon at least one dielectric interconnect layer. Generally, the interconnect layer contains a dielectric material in which is embedded electrical components and circuitry (typically constructed of a conductive metal, e.g., copper). The dielectric layer is often referred to in the art as an interlayer or interlevel dielectric (ILD) or intermetal dielectric (IMD).

It is well known in the art that the dielectric is susceptible to metal migration. Therefore, it is common practice in the art for a metal barrier composition (e.g., Ta, TaN, or TiN) to be situated between the conductive circuit paths and the dielectric layer. Since copper is the most common conductive metal, the metal barrier composition typically functions to prevent copper diffusion; however, a variety of metal barrier compositions are available for functioning as a barrier to metals other than copper.

Metal barrier and conductive metal layers are typically deposited by such methods as CVD, PECVD, PVD, which often include a sputtering or plasma process. However, as linewidths narrow to well below one micron and into the nanometer region (e.g., less than 500 nm), these techniques are becoming less and less capable of maintaining the resolution required for such linewidths. Furthermore, although these deposition techniques are most suitable for depositing metal layers several microns thick, these deposition techniques are difficult to control and adjust in attempting to produce metal layers of only a few nanometers thick, as would be required for producing a layer having a thickness of only one, two, or a few atom layers.

SUMMARY

The present application provides seeding compositions, as well as methods of use thereof, for depositing a layer of nanosized thickness (i.e., nanolayer) of conductive metal or metal barrier composition onto a semiconductor or dielectric substrate. Although the metal nanolayer can be used, itself, as a conductive metal or metal barrier layer, more typically, the metal nanolayer described herein is used as a seeding composition in the production of metal layers in which additional metal has been grown onto the seeding layer. The seeding compositions and methods of use described herein advantageously provide a conductive metal and a metal barrier layer of exceptional narrowness, thereby maintaining the resolution required for the rapidly diminishing linewidths being encountered in current semiconductor processes. The seeding compositions and methods of use described herein also advantageously bind selectively to surfaces of the semiconductor or dielectric material, thereby diminishing unwanted deposition of these metals on metal circuit paths or other semiconductor elements.

One aspect of the instant application is directed to a metal seed composition for depositing a seed layer of a conductive metal or metal barrier composition. In particular embodiments, the metal seed composition includes: a nanoscopic metal component that includes a metal useful as a metal diffusion barrier or conductive metal; an adhesive component for attaching said nanoscopic metal component on said semiconductor substrate; and a linker component that links said nanoscopic metal component with said adhesive component.

Another aspect of the instant application is directed to a semiconductor or dielectric substrate having coated thereon the metal seed composition described above in such a manner that the nanoscopic metal component is exposed (i.e., accessible and not covered or buried) in order that the nanoscopic metal component can be used as a seed for the further deposition of an additional metal. In some embodiments, when the seeding composition is deposited onto the substrate, the adhesive portion of the seeding composition forms a bond with the substrate, thereby retaining the adhesive portion. In other embodiments, when the seeding composition is deposited onto the substrate, the adhesive portion of the seeding composition makes an initial interaction with the substrate before being eliminated, thereby binding a portion of the linker component directly with the substrate.

Another aspect of the instant application is directed to methods for depositing a conductive metal or metal barrier seeding layer onto a semiconductor or dielectric substrate. In one particular embodiment, the method is specifically directed to depositing a metal diffusion barrier seed layer on an interlevel dielectric substrate. In another particular embodiment, the method is specifically directed to depositing a metal conducting seed layer on a semiconducting substrate.

To deposit a metal diffusion barrier seed layer onto a dielectric material, the metal diffusion barrier seed composition, described above, is bonded to a dielectric substrate (e.g., ILD or IMD), wherein the metal diffusion barrier seed composition includes: a nanoscopic metal barrier seed component that includes a metal useful as a metal diffusion barrier; an adhesive component for attaching the nanoscopic metal barrier seed component to the dielectric substrate; and a linker component that links the nanoscopic metal barrier seed component with the adhesive component. In the method, the metal diffusion barrier seed composition is typically attached to the interlevel dielectric substrate such that the nanoscopic metal barrier seed component is exposed.

To deposit a metal conducting seed layer on a semiconducting or dielectric substrate, the metal conducting seed composition, described above, is bonded to a semiconducting or dielectric substrate, wherein the metal conducting seed composition includes: (i) a nanoscopic metal conducting seed component that includes a conductive metal; (ii) an adhesive component for attaching the nanoscopic metal conducting seed component to the semiconducting or dielectric substrate; and (iii) a linker component that links the nanoscopic metal conducting seed component with the adhesive component. In the method, the metal conducting seed composition is typically attached to the semiconducting or dielectric substrate such that the nanoscopic metal conducting seed component is exposed.

BRIEF DESCRIPTION OF THE DRAWINGS

The drawings of the present application are provided for illustrative purposes only and, as such, the drawings are not drawn to scale, nor are they to be taken as comprehensive of all other possible features or modifications, not explicitly shown, which one skilled in the art may include or make.

DETAILED DESCRIPTION

In one aspect, the application describes a metal seed composition useful in depositing a seeding layer of a metal composition on a substrate useful in the art of semiconductor manufacturing. The seeding layer generally has a nanoscale thickness, i.e., up to or less than, for example, 100, 50, 25, 10, 5, 4, 3, 2, or 1 nm thickness.

Figure 1:
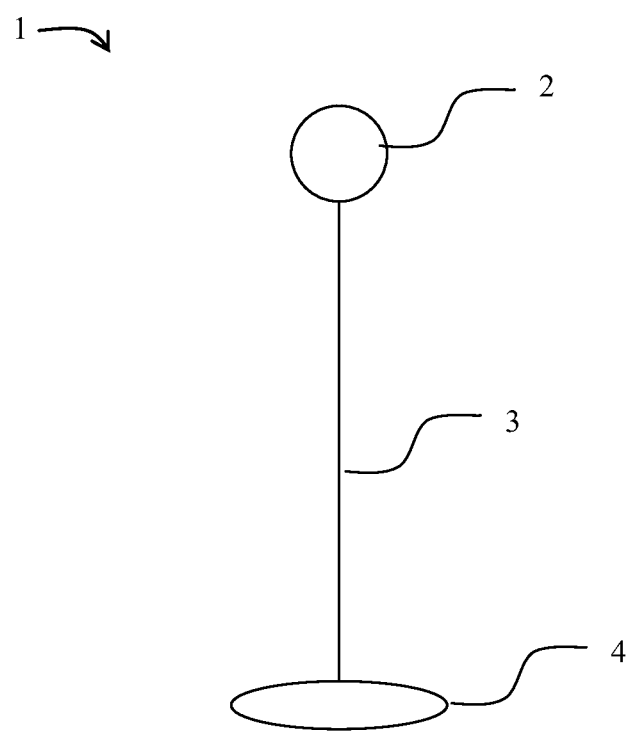
FIG. 1 is a pictorial representation illustrating the components of an exemplary metal seed composition described herein.

As stated above, the metal seed composition includes at least the following three components: a nanoscopic metal component, an adhesive component; and a linker component. Referring to the drawing shown in FIG. 1, the linker component 3 of the metal seed composition 1 links (i.e., connects) at least one nanoscopic metal component 2 with at least one adhesive component 4.

The nanoscopic metal component of the present disclosure is any metal-containing component that can function as a seed for further metal deposition. In order for the nanoscopic metal component to function as a seed for further metal deposition, the metal atoms in the nanoscopic metal component should be accessible, at least to some degree, to other additional metals that will be subsequently deposited. In other words, the metal in the nanoscopic metal component is typically not covered by or encapsulated within a chemical material that would preclude additional metal from contacting the nanoscopic metal component. The nanoscopic metal component can be, for example, a nanoparticle or organometallic complex. The nanoparticle can have a size of, for example, 1, 2, 3, 4, 5, 10, 15, 20, 30, 40, 50, 100, 150, or 200 nm, or a size within a range bounded by any two of the foregoing exemplary values. The organometallic complex contains at least one metal bound to one or more ligands. The one or more ligands can be monodentate or polydentate (i.e., chelating), e.g., bidentate, tridentate, tetradentate, pentadentate, hexadentate, or a higher denticity. The one or more ligands may also have any hapticity, e.g., $\eta^1$-$\eta^8$, particularly for unsaturated hydrocarbon ligands. The one or more ligands can bind the metal by the presence of one or more groups selected from, for example, hydroxy, amino, imino, carboxy, mercapto, and phosphino groups. Numerous ligands for binding metals are well-known in the art.

In one set of embodiments, the nanoscopic metal component has a metal barrier diffusion (i.e., "metal barrier") composition. The metal barrier composition can be any of the metal barrier compositions known in the art. Some examples of metal barrier compositions include those based on tantalum (Ta), e.g., Ta, TaN, TaSi, TaSiC, TaSiN, TaCN, TaC, $TaO_x$; those based on titanium (Ti), e.g., Ti, TiN, TiAlN, TiCN, TiW, TiSiN, TiON, TiWN; those based on tungsten (W), e.g., W, WN, TiW, WSiN, WCN; those based on ruthenium (Ru), e.g., Ru, RuN, RuTa, RuTaN, RuTiN, $RuSi_x$; those based on iridium (Ir), e.g., Ir, $IrO_2$, IrN, IrTa, IrTaN, IrSi; those based on molybdenum, e.g., Mo, MoN, $MoSi_2$, MoCN; those based on rhodium (Rh), e.g., Rh, RhO, RhN; those based on palladium (Pd), e.g., Pd, PdSi; those based on nickel (Ni); those based on cobalt (Co), e.g., CoN; as well as combinations, alloys, phosphide derivatives, and core-shell layered structures thereof. These nanoparticle compositions are either commercially available or prepared by methods known in the art.

In another set of embodiments, the nanoscopic metal component has a conductive metal composition. The conductive metal composition can be any of the conductive metal compositions known in the art. Some examples of conductive metal compositions include those based on copper (Cu), e.g., Cu, Cu alloys (e.g., CuNi, CuZn, CuAl, CuW, CuB, CuAg, CuAu); those based on aluminum (Al); those based on nickel (Ni); those based on cobalt (Co); those based on tungsten (W); those based on silver (Ag); those based on gold (Au); those based on polysilicon (polySi); those based on ruthenium (Ru); as well as combinations thereof, alloys thereof, conductive metal silicides thereof, layers thereof, and multilayers thereof.

The adhesive component of the metal seed composition is any one or more chemical groups that serve to bind (i.e., link or attach) the nanoscopic metal component via the linker component to a semiconductor or dielectric substrate. In embodiments where the substrate is an organic substrate, the adhesive component can be or include, for example, an unsaturated organic group that contains one or more carbon-carbon or carbon-nitrogen double or triple bonds, e.g., a vinylic, acetylenic, imine, cyano, acrylate, or maleimide group. Generally, the unsaturated organic group is not an aromatic group because of the inert (i.e., non-reactive) nature of such groups. Furthermore, the unsaturated group typically contains an end (i.e., terminal) unsaturated bond, i.e., with a methylene ($=CH_2$) portion. In particular embodiments, the unsaturated organic group includes an unsaturated ring group, particularly those that are reactive by possessing a degree of ring strain, e.g., cyclopropene, cyclobutene, cyclopentene, cyclopentadiene, cyclohexene, cyclohexadiene, norbornene, norbornadiene, and derivatives thereof (e.g., squaric acid).

The linker component links the nanoscopic metal component with the adhesive component. The linker can be any chemical group that functions to covalently link the nanoscopic metal and adhesive components. In several embodiments, the linker component contains one, two, three, four, five, six, seven, eight, nine, ten, fifteen, or up to twenty carbon atoms. In some embodiments, the linker component is polymeric, e.g., above twenty carbon atoms or monomer units.

In one set of embodiments, the linker component is an organic linker. The organic linker can be composed, for example, of at least one, two, three, or four carbon atoms, and up to five, six, seven, eight, nine, ten, eleven, or twelve carbon atoms. When more than one carbon atom is included, the carbon atoms can be linked together to form a straight-chained or branched saturated linker, i.e., —$(CH_2)_n$—, wherein n can be, for example, a number of 1 to 20, and one or more of the hydrogen atoms (H) can be replaced with a hydrocarbon group (e.g., methyl or ethyl), and/or two or more of the hydrogen atoms of adjacent carbon atoms can be removed to include a C—C double or tripled bond therein. In some embodiments, the linker is or includes a saturated or unsaturated ring linking group (e.g. cyclopentyl, cyclohexyl, or phenylene linking group). The linker may also include one or more heteroatoms (i.e., non-carbon or hydrogen atoms), such as one or more linking atoms selected from oxygen (—O—), nitrogen (—NH—), and sulfur (—S—), and/or one or more heteroatom groups, such as amide (—NHC(O)—), keto (—C(O)—), ester or carboxy (—OC(O)—), carbamate (—NHC(O)O—), urea (—NHC(O)NH—), diazene (—N═N—), as well as pendant groups, such as amino, hydroxy, carboxyl, thiol, ether, and aldehyde groups. In particular embodiments, the organic linker includes one or more ethylene oxide groups, i.e., (—CH$_2$CH$_2$O—)$_n$, wherein n can be precisely, at least, up to, or no more than, for example, 1, 2, 3, 4, 5, 10, 15, 20, 30, 40, or 50, or within a range bounded by any two of these values.

In particular embodiments, the organic linker is a conductive polymer. The conductive polymer can be any of the conductive polymers known in the art. Some examples of conductive polymers include, for example, polyp-phenylene vinylene), poly(3-hexylthiophene), polyacetylene, polyaniline, polypyrrole, and derivatized forms, copolymers, and mixtures thereof.

In another set of embodiments, the linker component is an inorganic linker. As used herein, an "inorganic linker" is defined as a linker that contains non-carbon atoms in its backbone structure. Thus, an inorganic linker may or may not include organic groups pendant on the backbone structure. The most common inorganic linker considered herein includes the siloxane linkers, which are readily available and known in the art. The siloxane linkers contain one, two, three, or more siloxy (≡Si—O—) groups, wherein the foregoing tripled line indicates three groups attached to the silicon atom (and not a triple bond, although unsaturated bonds containing silicon are also contemplated herein). In other embodiments, the inorganic linker includes one or more phosphazene (i.e., —(R)$_2$P═N—) groups, polysulfide groups (i.e., polysulfide salt or inorganic polysulfide), borazine (i.e., —B═N—) groups, and polystannane (i.e., —(R)$_2$Sn—) groups.

In some embodiments, the adhesive component includes a group distinct from groups present on the linker component. In other embodiments, the adhesive component is equivalent to a group (e.g., a repeating group) found in the linker component.

Any method known in the art for interconnecting a linker with the nanoscopic metal component and adhesive component can be used herein for constructing the metal seed composition. In particular embodiments, the metal seed composition is prepared by first obtaining a precursor molecule containing a linking portion with an adhesive portion thereon (e.g., an unsaturated organic group or reactive silyl group) and a portion reactive with a metal of interest, i.e., metallophilic groups, such as amino, hydroxyl, carboxylic, thiol, phosphino, or chelating groups. The precursor molecule is then reacted with a metal, typically in the form of a metal salt or metal nanoparticle, to produce a metal seed composition. For example, in one embodiment, a Ta or TaN seeding composition can be produced by reacting Ta or TaN nanoparticles or a Ta salt (e.g., tantalum chloride) with a linking molecule containing one to three hydroxy or carboxy groups on one end and an unsaturated organic group or reactive silyl group on the other end. In general, metal salt ions are reacted in solution to form a metal nanoparticle. The solution can contain a polymer which links to the metal, and displaces the counterion of the metal salt, thereby reducing the metal cation to a metal. This can take place in the presence of a base (base-catalyzed), or under UV irradiation (causing a free radical reaction where the metal is linked to the polymer).

In particular embodiments, the substrate is a dielectric substrate, suitable as an ILD or IMD layer. In some embodiments, the dielectric substrate is an alloy of silicon, such as silicon carbide (SiC, or more generically, Si$_x$C$_y$), silicon oxycarbide (SiOC, or more generically, Si$_x$O$_y$C$_z$), silicon nitride (Si$_3$N$_4$), and silicon carbide nitride (SiCN, or more generically, Si$_x$C$_y$N$_z$). In other embodiments, the dielectric substrate is an organosilicate glass (OSG) or fluorinated silicate glass (FSG), such as silicon dioxide or a silicate organic glass (SiOCH). The dielectric substrate can also be a low-κ dielectric material, typically defined as a material with a dielectric constant less than that of silicon dioxide (i.e., in different embodiments, a dielectric constant less than 4, 3.5, 3, 2.5, or 2). Some examples of low-κ dielectric materials include organic and inorganic silicate materials, such as siloxanes, polyorganosiloxanes, silsesquioxanes, organosilsesquioxanes, polysilazanes, polyimides, polyarylene ethers, polyarylene ether azoles, parylenes, polynapthalenes, arylene oxides (e.g., polyarylene ether, such as polyphenylene oxide), polyethylene and polypropylene. Some commercially available low-κ dielectric materials include FLARE™ (polyarylene ether), fluoro-polyimide, BCB™ (a divinylsiloxane bis-benzocyclobutene), SiLK™, Black-Diamond™ (a carbon-doped silicon dioxide), hybrid organosiloxane polymer (HOSP) materials, polynorbornenes, and PTFE. The dielectric may also be an ultra-low κ dielectric, such as a spin-on nanoporous silicon oxide-based material or other nanoporous dielectric material. Typically, the dielectric material is different in composition than the semiconducting material. In some embodiments, the semiconducting and dielectric layers may share a common base (i.e., matrix) material, while a difference in doping (i.e., in composition or level) determines the dielectric constant of the material.

The dielectric material may be porous, non-porous, or contain regions and/or surfaces that are porous and other regions and/or surfaces that are non-porous. The pores can be, for examples, nanopores (e.g., up to 1, 2, 5, 10, 50, 100, 250, or 500 nm), mesopores (e.g., 2-50 nm), or micropores (e.g., above 500 nm and up to, for example, 1, 2, 5, 10, 20, or 50 μm).

A layer of dielectric material can be formed utilizing any conventional deposition process including, but not limited to, chemical vapor deposition (CVD), plasma enhanced chemical vapor deposition (PECVD), evaporation, chemical solution deposition and spin-on coating. Typically, the dielectric material has a thickness from 50 nm to 1000 nm.

The adhesive component or a portion thereof is reacted with the substrate under conditions that cause the adhesive component or a portion thereof to covalently bind to the substrate. Alternatively, conditions are used under which the adhesive component or a portion thereof leaves in order to create a bond with a portion of the adhesive component and substrate, or directly between a portion of the linker and the substrate. In some embodiments, a chemical process is used for attaching the adhesive component to the substrate. In other embodiments, a physical process (e.g., irradiation or photolysis) is used for attaching the adhesive component to the substrate, either by itself or in conjunction with a chemical process. In particular embodiments, the reaction process includes spin-coating a solution of the seeding composition or a precursor thereof onto a substrate. The resulting spin coat is typically dried and thermally treated to produce a nano-thick layer of the seeding composition or a precursor thereof. If a precursor is deposited, the precursor may include a linker along with exposed metal-binding groups. The precursor is then contacted with a metal source (e.g., in solution or in the gas phase) to attach the nanoscopic metal component to the linker.

Particularly in embodiments where the substrate and adhesive component both possess unsaturated bonds, the unsaturated groups can be reacted with the substrate via a ring-opening metathesis polymerization (ROMP) reaction, with, for example, a Grubbs catalyst. The numerous conditions and types of catalysts used in ROMP reactions are all well known in the art. Alternatively, if the substrate contains silyl-hydride (Si—H) groups, an adhesive component containing one or more unsaturated groups can be reacted with the SiH groups via a hydrosilylation reaction. The numerous conditions and types of catalysts (e.g., Speier's catalyst) used in hydrosilylation reactions are all well known in the art. In another variation, if the substrate contains one or more unsaturated groups, the adhesive component may contain one or more Si—H groups to react with the substrate via a hydrosilylation reaction. In other embodiments, when the substrate and adhesive component both possess unsaturated bonds, a Diels Alder, addition reaction, or radical polymerization reaction may be used. In embodiments where the substrate is or includes metal oxide bonds (e.g., silicate, aluminate, or titanate), the adhesive component can be or include one or more metal alkoxide groups (e.g., alkoxysilane or siloxane group) or metal halide groups (e.g., chlorosilane groups), any of which can react with the metal oxide substrate via a sol gel process.

In alternative embodiments, a highly reactive group is included in the adhesive component to react with an unsaturated substrate. Some examples of highly reactive groups include alkyl halide, thiol, diazonium salt, isocyanate, boranes (as utilized, e.g., in hydroboration-oxidation reactions), and boronic acids (as utilized, e.g., in Suzuki and other coupling reactions). The highly reactive group can also be one (e.g., unsaturated halide or alkyl tin group) that can function in other known coupling reactions that often use a Pd catalyst, e.g., Heck and Stille reactions.

The process of attaching the metal seed composition to the substrate may also include one or more additional steps in which the substrate is modified to include groups that are reactive with the adhesive component of the metal seed composition. For example, in the case of a silicon substrate, the silicon surface may be treated by any of the means known in the art to produce silylhydride groups thereon, e.g., by washing with a solution of ammonium hydrogen fluoride (also known in the art as hydride passivation). The resulting silylhydride groups on the surface can then undergo reaction with an adhesive component reactive to silylhydride groups, including those types of reactions described above. In a particular embodiment, the hydride passivated surface is reacted with a metal seed composition containing a diazonium salt group in the adhesive component. As known in the art, a diazonium salt group (e.g., a diazonium aryl group, such as 3,4,5-trifluorobenzenediazonium tetrafluoroborate group) is generally reactive with silylhydride groups, typically by a free radical mechanism in which nitrogen ($N_2$) is released with concomitant formation of a silyl-aryl bond.

An unsaturated organic substrate may also be functionalized with reactive groups by any of the means known in the art, e.g., functionalization with hydroxy groups (e.g., by hydroboration-oxidation or by oxygen plasma processing). Other methods for functionalizing organic, particularly hydrophobic, surfaces to produce hydroxyl, alkoxyl, or oxycarbonyl groups thereon (e.g., via the Fenton reaction) are described in detail in U.S. Application Pub. No. 2008/0249272 to Bureau et al., the contents of which are incorporated by reference herein in their entirety. The resultant hydroxy groups can be reacted with, for example, one or more epoxy, glycidyl, or isocyanate groups contained in the adhesive component. A metal oxide substrate (e.g., silicon oxide) can also be activated by, for example, reacting the metal oxide surface with a functionalized siloxane molecule, i.e., that contains a reactive alkoxysilane group on one side and a reactive group on the other. Some examples of such functionalized siloxane molecules include those functionalized with an amino group (e.g., 3-aminopropyltrimethoxy-silane, 4-aminobutyltrimethoxysilane, 6-aminohexyltrimethoxysilane, 6-aminohexyltrichloro-silane, or an amino-derivatized silsesquioxane); those siloxane molecules functionalized with a reactive halide; those siloxane molecules functionalized with a hydroxy group; those siloxane molecules functionalized with a reactive unsaturated organic group (e.g., acryloyl-, vinyl-, or ethynyl-functionalized silane); those siloxane molecules functionalized with an epoxy or glycidyl group; those siloxane molecules functionalized with a mercapto group; those siloxane molecules functionalized with an aldehydic group (reactive with, for example, amino or phenolic groups in the adhesive component); and those siloxane molecules functionalized with an isocyanate group.

In other embodiments, the seeding composition, or a precursor thereof, can be attached to the substrate by electrografting of the seeding composition or precursor thereof. As known in the art, electrografting generally involves bonding of a chemical species to a surface by applying an electrical potential on the surface in the presence of the chemical species. When the chemical species is a polymeric precursor (e.g., an acrylate or methacrylate precursor), an electroinitiated or chemical-initiated polymerization process can be used if a polymer film is desired. The electrografting process is described in detail in, for example, U.S. Pat. No. 7,605,050, the contents of which are incorporated herein by reference in their entirety.

In particular embodiments, the method is practiced by spin-coating an (adhesive material)-(polymer linker)-(metal nanoparticle) complex onto a substrate whose surface was prepared through RIE damage. The RIE-damaged surface typically contains either dangling bonds, which can linked with, for example, an unsaturated organic adhesive component, or —OH groups, which can be linked with, for example, a siloxy-based adhesive component. During spin coating, the wafer can be heated to aid in the adhesion to the substrate.

Generally, when the substrate is a semiconducting substrate, a conductive metal composition is desired to be deposited thereon rather than a diffusion barrier composition. However, it is contemplated herein that certain applications can make use of a diffusion barrier composition deposited in a semiconductor layer, e.g., if diffusion of a conductive metal into a semiconducting substrate is to be prevented. Therefore, the metal seed compositions described above can be used for depositing either a conductive metal or diffusion barrier composition into a semiconducting substrate. In embodiments where a conductive metal is to be deposited into the semiconducting substrate, the nanoscopic metal component, described above, is or includes at least one conductive metal. Moreover, regardless of the nature of the nanoscopic metal component, the adhesive component should have the necessary groups to bind to the semiconductor substrate. For example, for a silicon-based inorganic semiconducting substrate (e.g., Si, SiC, or SiOC), the adhesive component can include RSi— groups for binding to the substrate. These moieties bind and remove the —OH group from the HO—Si—X group at the surface of the dielectric through Si bonding. Similarly, for organic semiconducting substrates, the adhesive component can include unsaturated or polyunsaturated $R(C=C)_x$ moities for binding to the substrate. These bind through the reaction of surface radicals (.R—R) on the organic dielectric substrate to an unsaturated group on the adhesive moiety by the formation of R—R groups. Both the —OH and .R surface groups on the dielectric surfaces can be formed through the RIE process (oxygen plasma exposure).

Figure 2:
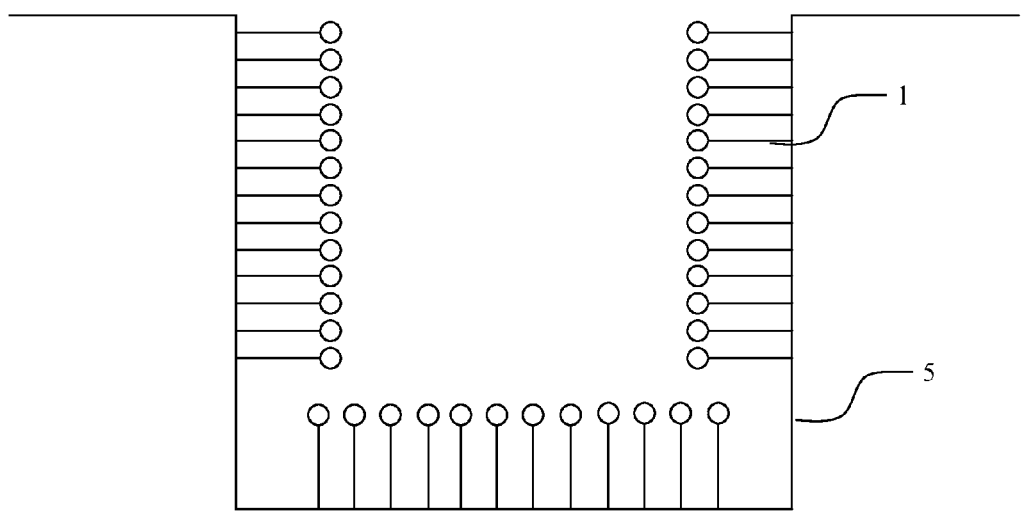
FIG. 2 is a pictorial representation illustrating a monolayer of the metal seed composition on a substrate.

In some embodiments, the seeding composition may form a monolayer or multilayered structure with no discernible degree of order. In other embodiments, as depicted in FIG. 2, a monolayer of seeding composition 1 with a significant degree of order is formed on the surface of a substrate 5. In embodiments where the substrate 5 is a semiconductor substrate, the seeding composition is generally a conductive metal seeding composition. In embodiments where the substrate 5 is a dielectric substrate, the seeding composition is generally a metal diffusion barrier seeding composition. In the foregoing embodiment, the metal diffusion barrier seeding composition can, itself, function as a diffusion barrier without the deposition of additional diffusion barrier material. Often, as known in the art, the dielectric substrate is present as a layer on a semiconducting substrate containing metal circuitry therein. Typically, a conducting line in the semiconducting substrate is contiguous with a wall of the dielectric layer, below a groove or trench made in the dielectric. In some embodiments, the diffusion barrier composition lines an exposed portion of conductive wire below the groove of the dielectric layer in addition to the groove surface of the dielectric, while in other embodiments, the diffusion barrier composition does not line the conductive wire below the groove of the dielectric layer while lining the groove surface of the dielectric.

Additional metal can be deposited onto the seed layer by any of the means known in the art. For example, particularly in the case of a conductive metal seed layer (e.g., Cu), an electroless plating process can be used. Numerous electroless plating processes and compositions are known in the art for depositing films of a wide variety of metals and metal alloys. In other embodiments, a chemical vapor deposition (CVD) or physical vapor deposition (PVD) process is used to deposit additional metal onto the seed layer. When a PVD process is used, the PVD process may include high temperature vacuum evaporation or plasma sputter bombardment of a target. Some particular types of PVD processes considered herein include, for example, sputter deposition, electron beam physical vapor deposition, pulsed laser deposition, cathodic arc deposition, and molecular beam epitaxy (MBE).

While the present disclosure has been particularly shown and described with respect to specific embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A dielectric substrate having coated thereon a metal seed composition useful in seeding a metal diffusion barrier or conductive metal layer, the metal seed composition comprising:
   a nanoscopic metal component that includes a metal useful as a metal diffusion barrier or conductive metal, wherein said nanoscopic metal component is exposed; and
   a linker component that links said nanoscopic metal component with said dielectric substrate.

2. The dielectric substrate of claim 1, wherein said nanoscopic metal component has a metal diffusion barrier composition.

3. The dielectric substrate of claim 2, wherein said metal diffusion barrier composition is comprised of at least one metal selected from Ta, Ti, Ru, Ir, Mo, Rh, Ni, Pd, Co, and W.

4. The dielectric substrate of claim 1, wherein said nanoscopic metal component has a conductive metal composition.

5. The dielectric substrate of claim 4, wherein said conductive metal composition is comprised of at least one metal selected from Cu, Ag, Au, Ni, W, Al, and Co.

6. The dielectric substrate of claim 1, wherein said linker component is an organic polymer.

7. The dielectric substrate of claim 6, wherein said organic polymer is a conductive polymer.

8. The dielectric substrate of claim 1, wherein said linker component is an inorganic polymer.

9. The dielectric substrate of claim 8, wherein said inorganic polymer is a siloxane polymer.

10. The dielectric substrate of claim 1, wherein said nanoscopic metal component further comprises an adhesive component.

11. The dielectric substrate of claim 10, wherein said linker component links said nanoscopic metal component with said adhesive.

12. The dielectric substrate of claim 10, wherein said adhesive component comprises a vinylic or acetylenic group.

13. The dielectric substrate of claim 10, wherein said adhesive component comprises a siloxane group.

14. The dielectric substrate of claim 1, wherein said dielectric substrate comprises a dielectric material selected from the group consisting of an alloy of silicon, an undoped or doped organosilicate glass, and a low k dielectric having a dielectric constant of less than 4.

15. The dielectric substrate of claim 14, wherein said dielectric material is porous.

16. The dielectric substrate of claim 14, wherein said dielectric material is non-porous.

17. A method for depositing a metal diffusion barrier seed layer on an interlevel dielectric substrate, the method comprising attaching a metal diffusion barrier seed composition on said interlevel dielectric substrate, wherein the metal diffusion barrier seed composition comprises:
   a nanoscopic metal barrier seed component that includes a metal useful as a metal diffusion barrier;
   an adhesive component for attaching said nanoscopic metal barrier seed component to said interlevel dielectric substrate; and
   a linker component that links said nanoscopic metal barrier seed component with said adhesive component;
wherein said metal diffusion barrier seed composition is attached to said interlevel dielectric substrate such that said nanoscopic metal barrier seed component is exposed.

18. The method of claim 17, wherein said interlevel dielectric substrate is an organic interlevel dielectric substrate reactive with an organic unsaturated group, and said adhesive component comprises a vinylic or acetylenic group.

19. The method of claim 17, wherein said linker component comprises a conducting polymer.

20. A method for depositing a metal conducting seed layer on a semiconducting or dielectric substrate, the method comprising attaching a metal conducting seed composition on said semiconducting or dielectric substrate, wherein the metal conducting seed composition comprises:
   a nanoscopic metal conducting seed component that includes a conductive metal;
   an adhesive component for attaching said nanoscopic metal conducting seed component to said semiconducting or dielectric substrate; and
   a linker component that links said nanoscopic metal conducting seed component with said adhesive component;
wherein said metal conducting seed composition is attached to said semiconducting or dielectric substrate such that said nanoscopic metal conducting seed component is exposed.

* * * * *